United States Patent [19]

Komine et al.

[11] Patent Number: 5,703,712

[45] Date of Patent: Dec. 30, 1997

[54] SILICA GLASS MEMBER FOR UV-LITHOGRAPHY, METHOD FOR SILICA GLASS PRODUCTION, AND METHOD FOR SILICA GLASS MEMBER PRODUCTION

[75] Inventors: Norio Komine, Sagamihara; Hiroki Jinbo, Kawasaki; Seishi Fujiwara, Sagamihara; Hiroyuki Hiraiwa, Yokohama, all of Japan

[73] Assignee: Nikon Corporation, Tokyo, Japan

[21] Appl. No.: 509,223

[22] Filed: Jul. 31, 1995

Related U.S. Application Data

[62] Division of Ser. No. 193,474, Feb. 8, 1994, abandoned.

[30] Foreign Application Priority Data

| Feb. 10, 1993 | [JP] | Japan | 5-22293 |
| Feb. 10, 1993 | [JP] | Japan | 5-22294 |
| Apr. 23, 1993 | [JP] | Japan | 5-98218 |
| Dec. 27, 1993 | [JP] | Japan | 5-330740 |

[51] Int. Cl.$^6$ ............... G02B 6/00; C03C 3/04; C03C 4/08; C03C 13/00
[52] U.S. Cl. ............... 359/350; 359/361; 65/399; 252/588; 501/53; 501/905
[58] Field of Search ............... 359/350, 361; 252/588; 65/3.11, 399; 501/53, 905

[56] References Cited

U.S. PATENT DOCUMENTS

| 5,086,352 | 2/1992 | Yamagata et al. | 359/350 |
| 5,325,230 | 6/1994 | Yamagata et al. | 359/350 |
| 5,410,428 | 4/1995 | Yamagata et al. | 359/350 |

*Primary Examiner*—Paul M. Dzierzynski
*Assistant Examiner*—Audrey Chang
*Attorney, Agent, or Firm*—Shapiro and Shapiro

[57] ABSTRACT

Recent UV-lithography is required to provide a fine and sharp pattern with a line width of 0.5 µm or less. The present invention provides a silica glass member adapted for use as an optical element for UV-lithography, by giving consideration to the RMS value of wave front aberration and the slant element of refractive index, which have not been considered in the art. Also, there is provided a silica glass member excellent in durability to the ultraviolet irradiation, by introduction of hydrogen molecules at the synthesis of the silica glass, instead of the using a secondary treatment for hydrogen introduction.

3 Claims, 6 Drawing Sheets

SILICA GLASS MEMBER FOR UV-LITHOGRAPHY, METHOD FOR SILICA GLASS PRODUCTION, AND METHOD FOR SILICA GLASS MEMBER PRODUCTION

This is a division of application Ser. No. 08/193,474 filed Feb. 8, 1994, now abandoned.

BACKGROUND OF THE INVENTION

1. Field of the Invention

The present invention relates to a silica glass member for UV-lithography, adapted for use in an optical system, such as a lens or a mirror in a wavelength region below 400 nm, particularly below 300 nm, and also to a method for producing silica glass, particularly synthesized silica glass for UV-lithography.

2. Related Background Art

In recent years, VLSI's have shown remarkable progress in the level of integration and in their functions, and, in the field of logic VLSI, there is being developed the system-on-chip concept, incorporating a large system on a single chip. Along with such trend, there is being required formation of finer geometry and higher level of integration on the substrate such as a silicon wafer. In the UV-lithographic technology for exposing and transferring fine patterns of integrated circuits onto a wafer such as of silicon, there is employed an exposure system called a stepper.

As an example, in the field of DRAM, along with advancement from LSI to VLSI, or with the increase in capacity from 1K to 256K, then 1M, 4M and 16M, there have been required steppers capable of reproducing progressively decreasing geometry starting from 10 µm, then 2 µm, 1 µm, 0.8 µm and 0.5 µm.

For this reason, the projection lens of the stepper is required to have a high resolution and a large depth of focus, which are determined by the wavelength of the light used for exposure and the numerical aperture (N.A.) of the lens.

As the patterns become finer, the angle of the diffracted light becomes larger, and a larger N.A. is required to collect such diffracted light. On the other hand, for a given pattern, the diffraction angle of the light becomes smaller as the wavelength $\lambda$ becomes shorter, so that the N.A. can be made smaller.

The resolution and the depth of focus can be represented as follows:

resolution=$k1 \cdot \lambda / N.A.$ depth of focus=$k2 \cdot \lambda / N.A.$ wherein k1 and k2 are coefficients of proportion.

An improvement in resolution can be achieved by an increase in N.A. or by a reduction in $\lambda$, but, as will be apparent from the foregoing equations, the reduction in $\lambda$ is more advantageous in consideration of the depth of focus. Based on such consideration, the wavelength of the light source is being shortened, from g-line (436 nm) to i-line (365 nm), and further to the light of KrF excimer laser (248 nm) and of ArF excimer laser (193 nm).

As the optical glasses generally employed in the illuminating system and the projection lens of the stepper become lower in transmittance in the wavelength region shorter than i-line, it is proposed to use, instead of such optical glasses, synthetic silica glass or monocrystalline fluorides such as fluorite ($CaF_2$). In particular, the synthetic silica glass shows very high transmittance over the entire wavelength range, and has much higher transmittance than any other glasses particularly in the short wavelength region less than 400 nm.

The optical system incorporated in the stepper is composed of a combination of a large number of optical elements such as lenses, and even a small loss in the transmittance per a single lens is accumulated by the number of lenses, thus leading to a significant decrease in the illumination intensity. For this reason, a higher transmittance is required for the optical elements. Also, as the wavelength of the light becomes shorter, the imaging performance is greatly affected even by a minute unevenness in the distribution of the refractive index.

Thus, for realizing finer geometry and obtaining fine and sharp patterns, there are required not only the high transmittance in the specified wavelength region but also other optical properties such as the homogeneity of refractive index, absence of striae and luminescence, laser durability etc.

Among these properties, the homogeneity of refractive index (fluctuation of refractive index within the measurement area) has been represented by the difference between the maximum and minimum values (hereinafter called PV value) of the refractive index within the measurement area, and silica glass is generally considered better in said homogeneity as this value becomes smaller. For this reason, the existing silica glass of so-called high homogeneity has been so produced as to minimize this PV value.

In some cases, however, fine and sharp patterns cannot be obtained even with thus produced silica glass of a sufficiently small PV value, generally not exceeding $2 \times 10^{-6}$.

Also there have proposed secondary treatments for improving the homogeneity (Japanese Patent Publication Nos. 03-17775 and 05-35688), and heat treatment in pressurized hydrogen gas for improving the laser durability (Japanese Patent Laid-Open Application No. 03-109233).

These methods are to apply, after silica glass is synthesized, a secondary treatment for improving the optical performance.

When silica glass is subjected to the irradiation of the light of ultraviolet region, there is generated an absorption band of 5.8 eV, called E' centers, significantly deteriorating the transmittance in the ultraviolet region. It is, however, reported that presence of hydrogen molecules can terminate the E' centers, thereby drastically reducing the loss in transmittance of silica glass in the ultraviolet region (U.S. Pat. No. 5,086,352).

In this manner, the hydrogen molecules present in silica glass have the effect of significantly improving the durability thereof to the ultraviolet light. For introducing hydrogen into silica glass, there has been proposed improvement in laser durability by heat treatment in pressurized hydrogen gas (Japanese Patent Laid-Open Application No. 03-109233). However, such conventional technology as explained above is associated with a drawback that a heat treatment (hydrogen treatment etc.) has to be applied after silica glass is once synthesized. State differently, in this method, heat has to be applied at least twice until the introduction of hydrogen molecules, so that the productivity becomes inevitably low and the cost of the final product is elevated. Also, the introduction of hydrogen molecules in the secondary treatment requires a process in hydrogen gas atmosphere, thus involving the danger of fire or explosion. Further there may result formation of a new absorption band or a light emission band, resulting from impurity contamination and/ or exposure to reducing atmosphere in the pressurized heat treatment at a high temperature.

In addition to the foregoing, with the increase in diameter of the lens employed in the UV-lithography based on the recent enlargement of the field size, there will be required a considerably long time for uniformly introducing hydrogen molecules into a silica glass optical element of a large caliber in the secondary treatment, in consideration of the diffusion coefficient. Furthermore, for a lens for UV-lithography, there is encountered a drawback that the central area, where a higher hydrogen concentration is required because of the highest energy density, becomes lower in the hydrogen concentration than in the peripheral area.

SUMMARY OF THE INVENTION

A first object of the present invention is to provide a silica glass member for UV-lithography, capable of providing a fine and sharp pattern with a line width of, for example, 0.5 µm or less in the UV-lithography, and a producing method therefor.

As a result of investigations on the homogeneity of refractive index of silica glass enabling to provide a fine and sharp exposed or transferred pattern in the UV-lithography, the present inventors have found that a line width of 0.5 µm or less can be obtained with a silica glass member for UV-lithography satisfying at least one of the following conditions:

1) RMS (root means square) of wave front aberration does not exceed 0.020λ after the removal of tilt power;
2) Slant element of refractive index does not exceed $\pm 5 \times 10^{-6}$;
3) distribution of refractive index is rotationally symmetrical with the axis of symmetry coinciding with the central axis of the silica glass member; and
4) the homogeneity of refractive index in the optical axis direction satisfies a condition $\Delta n \leq 2 \times 10^{-6}$ wherein $\Delta n$ is the amount of correction of power element.

The desired pattern with a line width of 0.5 µm or less can be obtained with silica glass satisfying any one of these conditions, but a more enhanced silica glass member for UV-lithography can naturally be obtained if a plurality of these conditions are satisfied.

It has furthermore been found out that the foregoing object can be attained more effectively, in cutting out a silica glass member from a synthesized silica glass ingot formed by depositing silica soot on a rotating target by emitting Si compound gas $SiH_nCl_{4-n}$ (n=0–4), oxygen gas and hydrogen gas from a burner, by effecting the cutting in such a manner that the central axis coincides with that of the silica glass member.

A second object of the present invention is to provide silica glass which contains hydrogen molecules of an amount necessary for suppressing the loss in transmittance resulting from ultraviolet irradiation, is free from bubbles, inclusions, striae or strain, is optically homogeneous and is provided with a high transmittance (particularly in the ultraviolet region) and a high durability to ultraviolet light.

As a result of investigations on the physical properties of silica glass capable of avoiding loss in the transmittance resulting from ultraviolet irradiation, the present inventors have found that a silica glass member adapted for use in UV-lithography can be obtained by satisfying at least one the following conditions:

1) the 10 mm internal transmittance exceeds 99.9% at 365, 248 and 193 nm;
2) the 10 mm internal transmittance exceeds 99.9% at 248 nm after irradiation with $10^6$ pulses of a KrF excimer laser with 400 mJ/cm²·pulse;
3) the 10 mm internal transmittance exceeds 99.9% at 193 nm after irradiation with $10^6$ pulses of an ArF excimer laser with 100 mJ/cm²·pulse; and
4) the hydrogen molecule concentration is at least equal to $5 \times 10^{17}$ molecules/cm³ and is higher in the central area than in the peripheral area.

The desired optical element excellent in durability to ultraviolet irradiation can be obtained with silica glass satisfying any one of the above-mentioned conditions, but a more enhanced silica glass member for UV-lithography can naturally be obtained if a plurality of these conditions are satisfied.

A third object of the present invention is to provide a method for producing silica glass which contains hydrogen molecules of an amount necessary for suppressing the loss in transmittance resulting from ultraviolet irradiation, without the secondary treatment and which has a high transmittance in the as-grown state.

The present inventors have made investigations regarding introduction of hydrogen molecules at the glass synthesis, thereby dispensing with the secondary treatment. As a result, it has been found possible to introduce hydrogen molecules with a high concentration at the synthesis, thereby dispensing with the secondary treatment, by maintaining a hydrogen excess state in the combustion gas around a circular raw material tube positioned at the center of the burner and serving to emit the Si compound gas. Also, it has been found that the transmittance of the synthesized silica glass becomes lower if the amount of excess hydrogen is too high in the combustion gasses emitted from the outermost annular combustion tube and the circular combustion tubes positioned therein.

More specifically, the above-mentioned object can be attained by a method satisfying a condition that:

1) "proportion of oxygen gas and hydrogen gas emitted from plural annular combustion tubes, excluding the outermost one" is maintained in a hydrogen excess state in comparison with the stoichiometric ratio and with "proportion of oxygen gas and hydrogen gas emitted from the outermost annular combustion tube and the circular combustion tube therein"; or
2) "proportion of oxygen gas and hydrogen gas emitted from plural annular combustion tubes, excluding the outermost one" is maintained in a hydrogen excess state in comparison with the stoichiometric ratio and "proportion of oxygen gas and hydrogen gas emitted from the outermost annular combustion tube and the circular combustion tube therein" is maintained equal to the stoichiometric ratio or at an oxygen excess state in comparison therewith.

The gas emissions from the burner with the above-mentioned proportions achieve introduction of hydrogen molecules with a high concentration at the synthesis, thereby dispensing with the secondary treatment. The maximum hydrogen molecule concentration achievable with this method is about $1 \times 10^{18}$ molecules/cm³. Though such hydrogen concentration is expected to provide a sufficiently high durability to ultraviolet light, a higher concentration of hydrogen molecules is desirable for attaining stronger durability to ultraviolet light. For introducing a larger amount of hydrogen molecules into silica glass, it has also been found out effective that the gasses emitted from the burner are maintained in a more excessive state in hydrogen at the central area, namely that:

3) hydrogen gas is used as the carrier gas for the Si compound gas.

Consequently, the above-mentioned third object can be attained by a method of emitting gasses from the burners with the proportions mentioned above, or additionally employing hydrogen gas as the carrier for the Si compound gas.

DETAILED DESCRIPTION OF THE PREFERRED EMBODIMENTS

Figure 1:
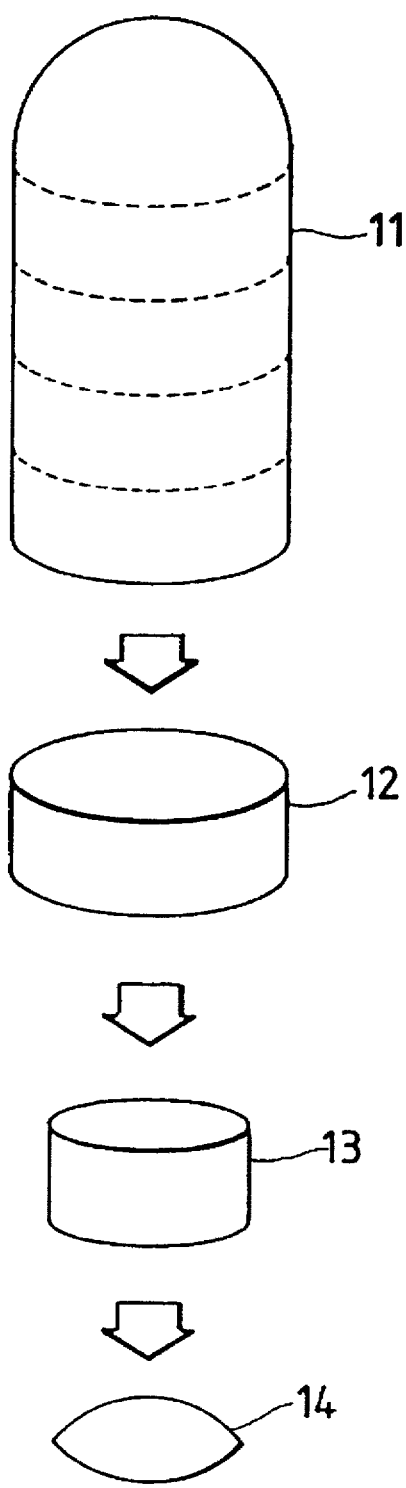
FIG. 1 is a schematic view showing the method of producing silica glass of the present invention for UV-lithography.

A projection lens, produced with silica glass elements of the present invention, can provide optical properties required for producing fine and sharp patterns in the UV-lithographic technology.

The homogeneity of the refractive index has conventionally been evaluated solely by the PV value (without correction for power element). However, the refractive index distribution can be separated, for example, into a power (second-order) element, an asymmetry element, a rotary symmetry element, a slant element, a random element etc., which mutually overlap to constitute the entire distribution, and these elements have respectively different influences on the optical performance. Consequently, a lens constructed with silica glass elements of a given PV value may show different optical performance if the proportion of these elements is different. Therefore, more control of the PV value within a certain limit (for example $2 \times 10^{-6}$ or less as usually accepted) without sufficient and individual consideration of these elements cannot provide a projection lens satisfying the designed performance, nor can provide a fine and sharp pattern in the lithographic technology.

In the following there will at first be explained the RMS value (after correction of power element) of the wave front aberration. In comparison with the PV value conventionally employed, the RMS value (after correction of power element) of wave front aberration represents only a component directly influencing the optical performance, and can thus more reliably ensure the optical performance.

The power element is same as the error in the radius of curvature, and can be corrected easily by the curvatures of lenses or by the air gap therebetween. Consequently, there should be considered the power element after the correction, which directly influences the image quality.

In the following there will be explained why the RMS value should be employed instead of the PV value.

Instead of the PV value of the wave front aberration, there is usually employed the PV value converted into the refractive index in the following manner (called $\Delta n$).

As an example, in case of a PV value of wave front aberration of $0.30 \lambda$ and a thickness t of 30 mm, with $\lambda$ being the wavelength 632.8 nm of the light source of the interferometer, the above-mentioned conversion is conducted as follows:

$$\Delta n (PV) = 0.30 \times 632.8 \times 10^{-9}/30 \times 10^{-3}$$
$$= 6.4 \times 10^{-6}$$

This value, being converted into the difference of the refractive index, is independent from the thickness.

However, in order to individually define the properties lenses of different thicknesses in the optical system of the projection lens, consisting of a combination of plural lenses of different diameters and thicknesses, it is essential to use the measured wave front aberration itself, instead of the above-mentioned converted value.

Furthermore the PV value is susceptible to the influence of error factors such as noises, because it is obtained by the comparison of the maximum and minimum values only in the measuring area. On the other hand, the RMS (root mean square) value is less influenced by the measuring errors as it is calculated from all the measured values, and also enables statistical treatment.

For these reasons, there is employed the RMS value of the wave front aberration after the correction of power element. Also, the upper limit $0.020 \lambda$ is determined for fully exhibiting the performance of the projection lens, as a result of a simulation in consideration of various aberrations resulting from different elements, other than the power element, of the refractive index distribution. Stated differently, a state above $0.020 \lambda$ results in increased aberrations inadequate for an element for UV-lithography.

Although the power element itself is correctable as explained before, a very large amount of correction requires cumbersome operations in the lens adjustment, thus leading to an increased cost. For this reason, the amount $\Delta n$ of correction of the power element in the homogeneity of the refractive index has to be maintained within a limit $\Delta n \leq 2 \times 10^{-6}$.

Also, the slant element of refractive index and the form of the refractive index distribution are important factors in the optical performance.

When a lens element is incorporated in an optical system, said lens element is adjusted to the concentric state by aligning the central axis thereof with that of the optical axis. However, even with such adjustment, the desired optical performance cannot be obtained if the refractive index distribution is not rotationally symmetrical but includes a slant element. The desired optical performance can ideally be reached when the refractive index distribution is rotationally symmetrical without the slant element, by matching the axis of said rotary symmetry with the central axis of the lens and with that of the optical axis.

The adjustment of the optical system can be facilitated preferably by the use of a silica glass element having only one maximum or minimum value in the refractive index distribution, namely a convex or concave distribution, in a cross section containing the incident optical axis.

In the following there will be explained the slant element of the refractive index.

A slant element in the refractive index has an effect similar to that of an eccentricity of each lens element. For estimating the eccentricity tolerance (lateral shift and tilt of lens element) in the projection lens, the following three conditions have been investigated by a simulation:

1) trapezoid of distortion;

2) fluctuation of astigmatism within the exposure field; and 3) eccentric coma aberration.

Based on the obtained result, it has been determined to be desirable, in order to satisfy the design performance, to maintain the above-mentioned slant element within a range of $\pm 5 \times 10^{-6}$, namely to limit the maximum difference in refractive index between the radial ends of a lens within $5 \times 10^{-6}$.

In the following there will be explained the form of the refractive index distribution.

Although it is desirable that the axis of rotatory symmetry of refractive index distribution of the silica glass member coincides with the central axis of the lens element prepared therefrom, a certain tolerance has to be allowed industrially.

Based on the result of a simulation similar to the case of the slant element, it has been determined to be possible to obtain the desired optical performance by maintaining the above-mentioned tolerance within 5 mm, thereby maintaining the axis of rotary symmetry of the refractive index distribution substantially the same as the central axis of the glass element.

In the following there will be explained the method for obtaining a silica glass member as explained above.

For this purpose there is employed the direct method which enables attachment of higher durability to the light of an excimer laser and a larger product form, in comparison with other methods.

The refractive index distribution of silica glass is determined by density distribution, dependent on the impurities therein and the thermal hysteresis. The possible impurities are OH, Cl, metallic impurities and dissolved gasses, but, in case of the direct method, dominant ones will be OH present in excess of 100 ppm and Cl present in excess of 10 ppm. Other impurities, generally present an less than 50 ppb level according to the analyses, are negligible in terms of influence on the refractive index.

Within the density distribution, the thermal hysteresis is the governing factor throughout various manufacturing methods such as the direct method, VAD (vapor axial deposition) method, solgel method and plasma burner method. Because the refractive index distribution is determined by such factors as explained above, there is required, in order to obtain a silica glass member having a small RMS value, a refractive index pattern of substantial rotary symmetry or a small slant element, a manufacturing method capable of constantly maintaining the geometrical center throughout the steps of synthesis, heat treatment for homogenization or form change, annealing for strain removal, and mechanical working such as cutting or rounding.

Silica glass synthesis conducted with ingot rotation always brings about rotary symmetry in the distribution of impurity concentration, and physical properties, and in the distribution of refractive index based thereon. The obtained ingot is at first cut into a cylindrical shape. As the lateral face of this cylindrical shape is constituted by that of the ingot, the geometrical center of the cylindrical shape, determined from the lateral face thereof, coincides with the center at the ingot synthesis, or the center of the refractive index distribution. The thus determined center is marked on the cross section of the cylindrical shape and is used as the reference central point in the succeeding working steps such as cutting or rounding, whereby the central axis of the ingot coincides with that of the silica glass member. Accordingly there can finally be obtained an optical member having a rotationally symmetrical distribution of the refractive index.

In the following there will be given more detailed explanation on the steps of silica glass synthesis by the direct method, with reference to FIG. 1.

In the process shown in FIG. 1, the distribution of impurity concentration and of physical properties becomes always rotationally symmetrical, as the synthesis is conducted with rotation of the ingot 11. However, as the center position is always maintained while a cylindrical silica glass member 12 is cut out, the weight yield becomes significantly low unless the diameter of the ingot is close to the required diameter of the member.

In case of heat treatment such as annealing, in order to maintain the symmetrical character, it is necessary to form the element in a cylindrical shape and to apply the heat at the center of a furnace having a rotationally symmetrical temperature distribution. In such operation, the silica glass member is preferably rotated. In case of causing a viscous deformation, particular attention is required in order not to cause an eccentric deformation.

Figure 2:
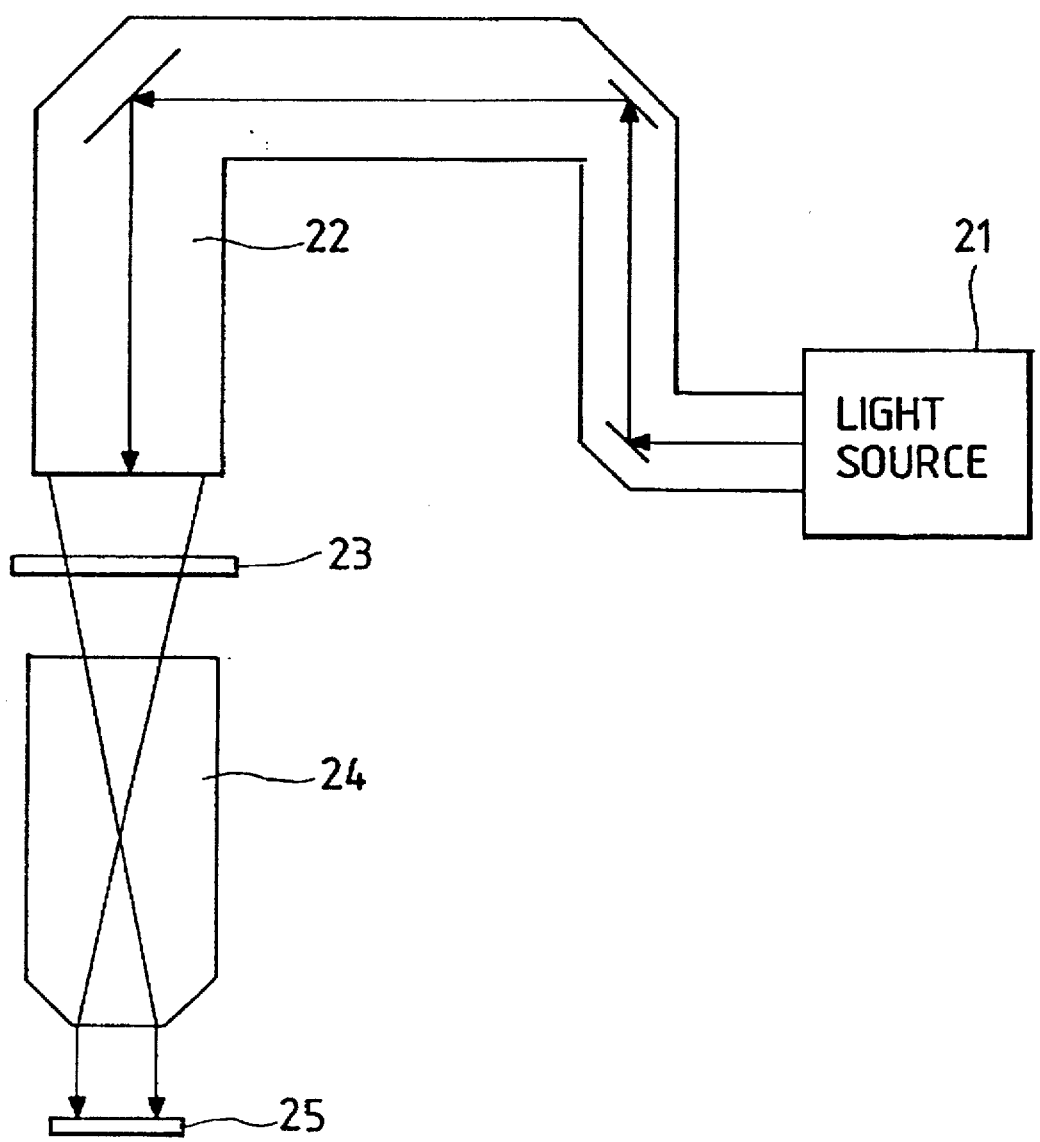
FIG. 2 is a schematic view of a lithographic apparatus incorporating a projection lens produced with silica glass members of the present invention for optical lithography.

In obtaining a silica glass member 13 through a working such as rounding, the central position is marked before such working and the working step has to conducted so as not to cause a positional displacement. The silica glass member 13 is further worked and polished to obtain a lens element 14. In a schematic view of an excimer laser stepper shown in FIG. 2, a projection lens 24 for pattern exposure and transfer is constructed by preparing lenses 14 of various shapes through the above-explained process and combining these lenses in a lens barrel. In FIG. 2, there are shown an excimer laser unit 21, an illuminating system 22 therefor, a reticle 23, and a silicon wafer 25 receiving the reduction projected image. Through the above-explained operations, there can be obtained optical performance required for providing a fine and sharp pattern in the lithographic process.

More specifically, as explained in the foregoing, the present invention enables attainment of a fine pattern with geometry of 0.5 μm or even smaller in the lithographic process.

Also, instead of the PV value susceptible to the influence of error factors such as noises, there is employed the RMS value which alleviates the influence of measuring errors and enables statistical treatment.

Silica glass of a given shape and a given weight has been priced higher for a smaller PV value, but the present invention enables the use of even an inexpensive silica glass member with a large PV value, as long as the RMS value of wave front aberration after the correction of power element does not exceed 0.020 λ, thereby making it possible to reduce the cost of the lithographic apparatus.

Furthermore, there have been required very cumbersome adjustments in constructing the projection lens with lens elements prepared from silica glass members of which the refractive index contains a large slant element or is not rotationally symmetrical about the optical axis, but the present invention makes it possible to significantly reduce the time required for such adjustments.

The silica glass member of the present invention, when applied to UV lithography, is usable not only for pattern exposure and transfer with the light of a specified wavelength region below 400 nm, but also for wafer alignment with the light of a laser, such as a He—Ne laser (632.8 nm).

In the following there will be explained a silica glass member of the present invention, excellent in durability to ultraviolet light.

As explained before, the introduction of hydrogen molecules into silica glass has been mostly achieved by a secondary process, such as with a hot isostatic press or furnace with a high temperature and a high pressure. Such secondary treatment may result in formation of oxygen deficient defects, formation of a new absorption band, resulting from contamination with impurities such as sodium and constituting a drawback in the use as a UV optical member, and loss of transparency depending on the temperature of heat treatment.

The method of the present invention avoids such drawbacks, as it does not require the secondary treatment.

Also, in contrast to the secondary treatment which shows difficulty in introducing hydrogen molecules into a silica glass member of a large caliber, the method of the present invention, achieving the introduction of hydrogen molecules at the synthesis, can maintain a high level of hydrogen molecule concentration regardless of the silica glass caliber.

In the following the mechanism of hydrogen molecule introduction at the synthesis is explained.

Though the process of dissolution of hydrogen molecules into silica glass at the synthesis has not been sufficiently clarified, it is estimated that the formation of soot-like silica glass powder by hydrolysis of the Si compound emitted together with the carrier gas takes place with involvement of hydrogen molecules of a certain proportion. Consequently, if excess in hydrogen is created in an area close to the center, the probability of dissolution of hydrogen molecules into the silica glass should become higher, so that the concentration of hydrogen molecules should become higher.

If the amount of hydrogen is increased over the entire burner, the ratio of total hydrogen and total oxygen becomes rich in hydrogen, so that the amount of hydrogen molecules dissolved into the silica soot increases. However, the synthesized silica glass then develops oxygen deficient defects such as Si—Si, leading to a lowered transmittance below 225 nm. Such silica glass is undesirable as the optical element for UV-lithography.

It is nevertheless possible to efficiently elevate the hydrogen molecule concentration in the silica glass, without a substantial change in the amount of hydrogen over the entire burner, by employing hydrogen gas as the carrier gas in the emission of the Si compound gas from the circular raw material tube.

The hydrogen molecule concentration in silica glass can also be elevated by maintaining a hydrogen excess state in the proportion of oxygen gas and hydrogen gas emitted from plural annular combustion tubes excluding the outermost area. In this method, it is not advisable to create a hydrogen excess state in the proportion of the combustion gasses (combustion maintaining gas and combustion supporting gas) in the outermost area, because this area tends to generate an atmosphere excessive in hydrogen and deficient in oxygen, due to the much higher gas flow rate than in any other area, thereby generating oxygen deficient defects in the synthesized silica glass and resulting in a lowered transmittance below 225 nm.

Such inclusion of hydrogen molecules at a high concentration in the silica glass enables improvement in the durability to ultraviolet light, without being required to consider contamination or danger.

The silica glass produced by the method of the present invention satisfies physical properties directly affecting the refractive index distribution, and required of the optical element for use in the UV-lithography.

The method of the present invention can provide silica glass of which 10 mm internal transmittance exceeds 99.9% at 365, 248 and 193 nm, in any part of the silica glass. Such silica glass has not been known in the art.

Also, there can be obtained silica glass of which 10 mm internal transmittance exceeds 99.9% at 248 nm after irradiation with $10^6$ pulses of a KrF excimer laser at 400 mJ/cm$^2$·pulse, or 10 mm internal transmittance exceeds 99.9% at 193 nm after irradiation with $10^6$ pulses of an ArF excimer laser at 100 mJ/cm$^2$·pulse. This is based on a fact that silica glass of the present invention has a hydrogen concentration at least equal to $5 \times 10^{17}$ molecules/cm$^3$ in any part and that the hydrogen concentration is higher in the central part than in the peripheral part. Such silica glass does not easily form defects by the ultraviolet irradiation, and satisfies the durability required of the optical element for use in the UV-lithography.

This is based on a fact that the method of the present invention for producing silica glass does not require the secondary treatment undesirably affecting these optical properties.

The hydrogen molecule concentration in thus obtained silica glass ingot assumes a convex distribution which relatively mildly varies in the central area and monotonously decreases toward the peripheral area. Silica glass with such convex distribution of hydrogen molecule concentration, when used as an optical element for UV-lithography, can maintain the durability to ultraviolet light at the central area where the energy density is highest. Though such convex distribution of hydrogen molecule concentration is desirable, the difference in concentration between the central and peripheral areas should be maintained at a level of $2 \times 10^{17}$ molecules/cm$^3$, because a difference exceeding the above-mentioned level leads to an excessive fluctuation in the ultraviolet durability depending on the location within the glass member, so that the desired optical performance can no longer be maintained.

[EXAMPLE 1]

Tables 1 and 2 show the producing conditions and physical properties of silica glass of examples 1-1 to 1-3 and reference examples 1-1 and 1-2. Also Tables 3 provides explanation for the symbols ○, Δ, and X used in the Tables 1 and 2.

TABLE 1

| | sample No. | | | | | |
|---|---|---|---|---|---|---|
| | 1 | 2 | 3 | 4 | 5 | 6 |
| gas and flow rate (slm) | | | | | | |
| 31 | H$_2$ 70.0 | H$_2$ 70.0 | H$_2$ 70.0 | O$_2$ 19.8 | O$_2$ 19.8 | O$_2$ 19.8 |
| 32 | O$_2$ 19.8 | O$_2$ 19.8 | O$_2$ 19.8 | H$_2$ 70.0 | H$_2$ 70.0 | H$_2$ 70.0 |
| 35 | O$_2$ 136.4 | O$_2$ 149.6 | O$_2$ 84.8 | O$_2$ 132.0 | O$_2$ 147.4 | O$_2$ 151.8 |
| 36 | H$_2$ 310.0 | H$_2$ 340.0 | H$_2$ 300.0 | H$_2$ 300.0 | H$_2$ 335.0 | H$_2$ 345.0 |
| carrier gas | H$_2$ | H$_2$ | H$_2$ | O$_2$ | He | Ar |
| flow rate of carrier gas (slm) | 1.80 | 1.80 | 1.80 | 1.80 | 1.80 | 1.80 |

TABLE 1-continued

| | sample No. | | | | | |
|---|---|---|---|---|---|---|
| | 1 | 2 | 3 | 4 | 5 | 6 |
| flow rate of raw material (g/min) | $SiCl_4$, 10 | $SiHCl_3$, 10 | $SiCl_4$, 10 | $SiCl_4$, 10 | $SiCl_4$, 10 | $SiCl_4$, 10 |
| birefringence | ○ | ○ | X | ○ | ○ | ○ |
| refractive index homogeneity | | | | | | |
| through thickness | | | | | | |
| Δn | ○ | ○ | X | Δ | Δ | Δ |
| RMS | ○ | ○ | Δ | Δ | Δ | Δ |
| slant element | ○ | ○ | ○ | ○ | Δ | Δ |
| through width | | | | | | |
| Δn | ○ | ○ | ○ | ○ | Δ | ○ |
| hydrogen molecule contents (molecules/cm$^3$) | $4.1 \times 10^{18}$ | $3.1 \times 10^{18}$ | $6.9 \times 10^{18}$ | $3.5 \times 10^{17}$ | $7.8 \times 10^{16}$ | $6.2 \times 10^{16}$ |
| transmittance | | | | | | |
| before irradiation | | | | | | |
| 365 nm (%) | >99.9 | >99.9 | >99.9 | >99.9 | >99.9 | >99.9 |
| 248 nm (%) | >99.9 | >99.9 | >99.9 | >99.9 | >99.9 | >99.9 |
| 193 nm (%) | >99.9 | >99.9 | 99.1 | >99.9 | >99.9 | >99.9 |
| after irradiation | | | | | | |
| 248 nm (%) | >99.9 | >99.9 | >99.9 | 99.8 | 99.1 | 98.7 |
| 193 nm (%) | >99.9 | >99.9 | 99.2 | 99.4 | 98.0 | 96.5 |
| absorption bands | | | | | | |
| before irradiation (eV) | no | no | 7.1 | no | no | no |
| after irradiation (eV) | no | no | 5.8, 7.1 | 5.8 | 5.8 | 5.8 |
| diameter of ingots (mm) | 170 | 180 | 170 | 180 | 200 | 190 |

TABLE 2

| | sample No. | | | | |
|---|---|---|---|---|---|
| | 7 | 8 | 9 | 10 | 11 |
| gas and flow rate (slm) | | | | | |
| 41 | $H_2$ 45.0 | $H_2$ 90.0 | $O_2$ 19.8 | $O_2$ 17.6 | $H_2$ 45.0 |
| 42 | $O_2$ 13.2 | $O_2$ 39.6 | $H_2$ 45.0 | $H_2$ 60.0 | $O_2$ 13.2 |
| 43 | $H_2$ 90.0 | $H_2$ 90.0 | $O_2$ 52.8 | $O_2$ 52.8 | $H_2$ 90.0 |
| 44 | $O_2$ 39.6 | $O_2$ 26.4 | $H_2$ 120.0 | $H_2$ 120.0 | $O_2$ 39.6 |
| 45 | $O_2$ 160.6 | $O_2$ 191.4 | $O_2$ 118.8 | $O_2$ 226.6 | $O_2$ 159.6 |
| 46 | $H_2$ 365.0 | $H_2$ 435.0 | $H_2$ 270.0 | $H_2$ 515.0 | $H_2$ 456.0 |
| carrier gas | $H_2$ | $H_2$ | $O_2$ | $O_2$ | $H_2$ |
| flow rate of carrier gas (slm) | 1.80 | 1.80 | 1.80 | 1.80 | 1.80 |
| flow rate of raw material (g/min) | $SiCl_4$, 20 | $SiCl_4$, 20 | $SiCl_4$, 20 | $SiCl_4$, 20 | $SiCl_4$, 20 |
| birefringence | ○ | ○ | ○ | ○ | X |
| refractive index homogeneity | | | | | |
| through thickness | | | | | |
| Δn | ○ | ○ | Δ | Δ | X |
| RMS | ○ | ○ | Δ | ○ | Δ |
| slant element | ○ | ○ | ○ | ○ | Δ |
| through width | | | | | |
| Δn | ○ | ○ | ○ | ○ | Δ |
| hydrogen molecule contents (molecules/cm$^3$) | $2.6 \times 10^{18}$ | $1.5 \times 10^{18}$ | $4.3 \times 10^{17}$ | $<1 \times 10^{16}$ | $4.2 \times 10^{18}$ |
| transmittance | | | | | |
| before irradiation | | | | | |
| 365 nm (%) | >99.9 | >99.9 | >99.9 | >99.9 | >99.9 |
| 248 nm (%) | >99.9 | >99.9 | >99.9 | >99.9 | >99.9 |

TABLE 2-continued

| | sample No. | | | | |
|---|---|---|---|---|---|
| | 7 | 8 | 9 | 10 | 11 |
| 193 nm (%) after irradiation | >99.9 | >99.9 | >99.9 | >99.9 | 99.0 |
| 248 nm (%) | >99.9 | >99.9 | 99.8 | 99.7 | 99.9 |
| 193 nm (%) absorption bands | >99.9 | >99.9 | 99.7 | 99.4 | 99.4 |
| before irradiation (eV) | no | no | no | no | 7.1 |
| after irradiation (eV) | no | no | 5.8 | 5.8 | 5.8, 7.1 |
| diameter of ingots (mm) | 270 | 370 | 300 | 400 | 300 |

TABLE 3

| | ○ | △ | × |
|---|---|---|---|
| birefringence through thickness | 0–1 nm/cm | 1–2 nm/cm | >2 nm/cm |
| $\Delta n \times 10^6$ | 0–1 | 1–2 | >2 |
| RMS $\times 10^4$ $\lambda$ | 0–100 | 100–200 | >200 |
| slant element $\Delta n \times 10^6$/cm | 0–5 | 5–10 | >10 |
| through width $\Delta n \times 10^6$ | 0–2 | 2–4 | >4 |

In Tables 1 and 2, the numbers 31, 32, 35, 36 and 41 to 46 appearing in the columns of gas and flow rates correspond respectively to those in FIGS. 4, 5 and 6, 7.

[EXAMPLE 1-1]

Figure 4:
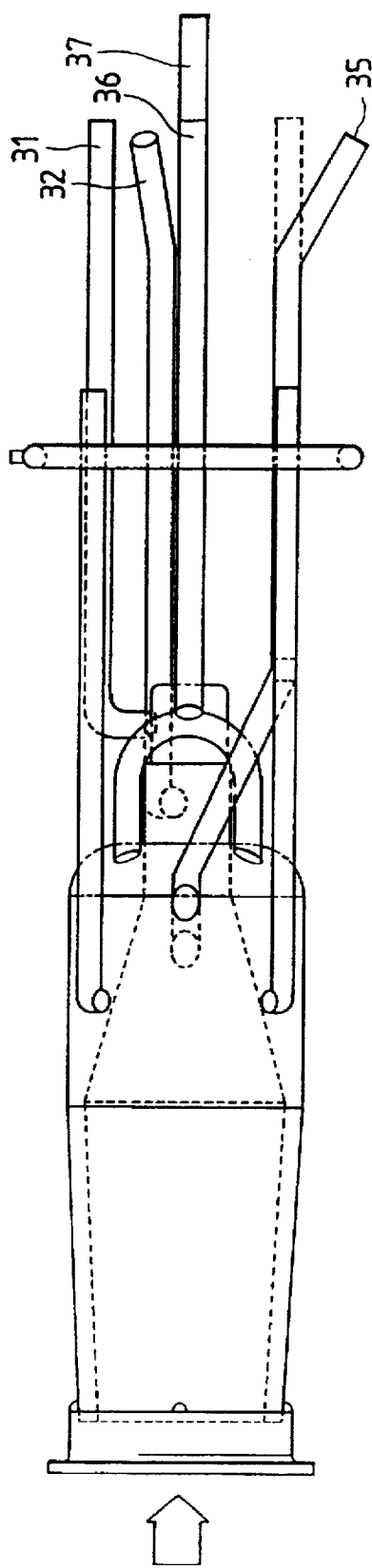
FIG. 4 is an external view of a burner employed in the synthesis of silica glass.
Figure 5:
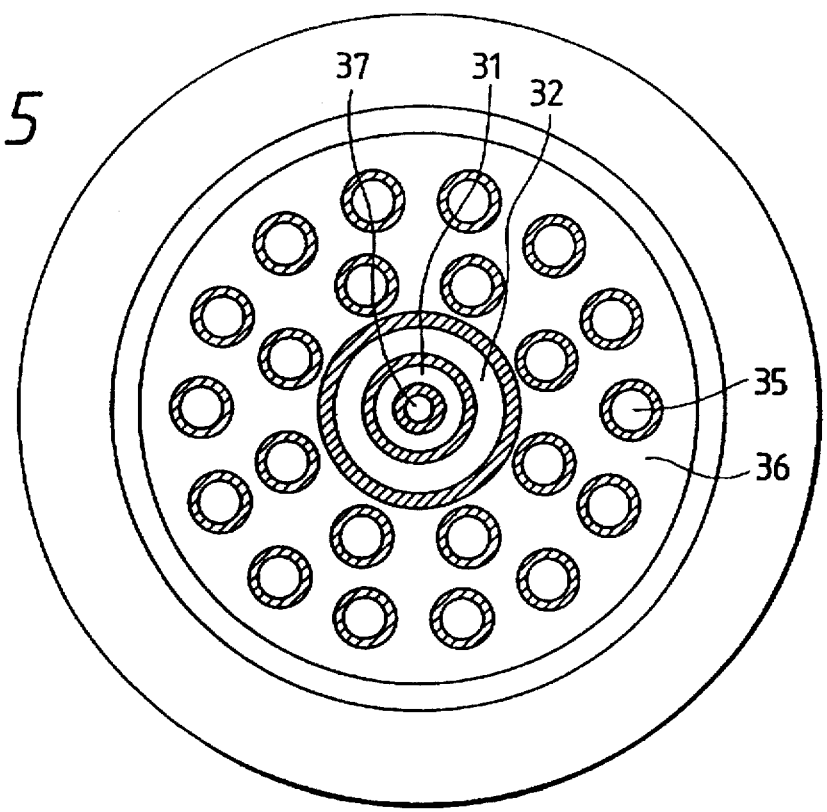
FIG. 5 is a view of the burner shown in FIG. 4, seen from a direction indicated by an arrow therein (wherein numbers correspond to those in Table 1 indicating the gas species and flow rates thereof)

A silica glass ingot of high purity was synthesized by the so-called direct method utilizing silicon chloride gas of high purity as the raw material and employing a multiple-tube burner made of silica glass, as shown in FIGS. 4 and 5, in which oxygen gas and hydrogen gas were burnt and the raw material gas diluted with carrier gas was emitted from a central portion 37. At the synthesis, a target, consisting of an opaque silica glass plate, for deposition of silica glass powder was rotated and traversed at a constant period and was lowered at the same time in such a manner that the top of the ingot stays at a constant distance from the burner. In addition to these movements, the temperature distribution of the upper part of the ingot was measured and the burner and the ingot were subjected to planar movements according to the obtained temperature information. This was done in order to optimize the homogeneity of refractive index of the obtained silica glass, by combining the temperature distribution pattern in the upper part of the ingot, resulting from the shape of the burner and the amounts of gasses and the temperature distribution pattern resulting form the relative movement of the burner and the ingot.

Figure 8:
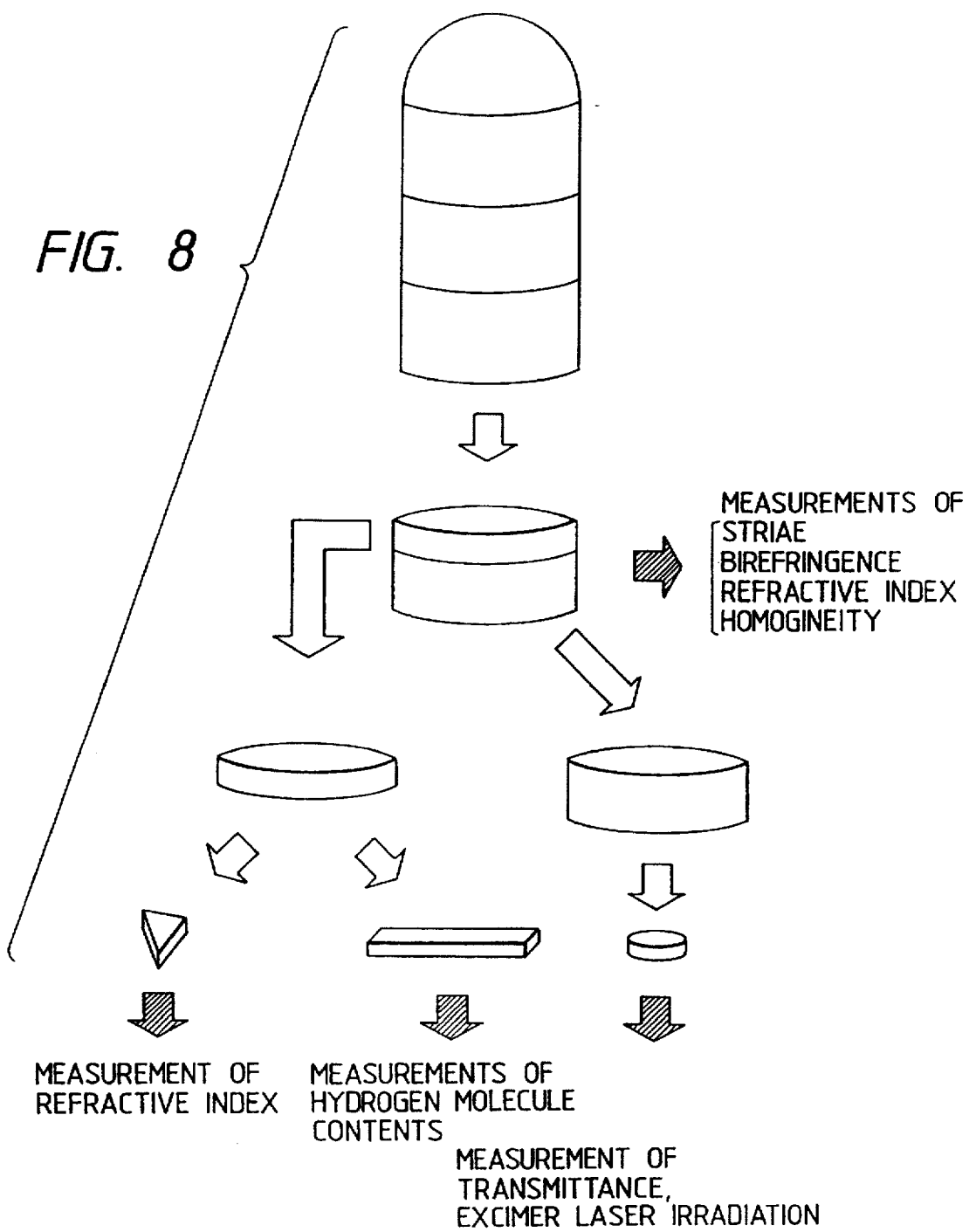
FIG. 8 is a view showing the process flow for cutting a sample out of a silica glass ingot.

Plural ingots were synthesized in this manner, under precise control of the synthesizing conditions (burner structure, gas amounts, target traversing pattern etc.) in the direct method, and, from these ingots (φ160–500 mm, L800–1200 mm), disk-shaped test pieces (φ150–450 mm, t50 mm) were cut out in a horizontal direction, at every 50–100 mm, matching the rotatory center of the ingot. Each sample was subjected to the measurement of striae under a high-pressure mercury lamp, measurement of strain by an auto birefringence measuring instrument, and measurement of refractive index distribution in the axial direction and in a direction perpendicular thereto, by the oil-on-plate method utilizing a He—Ne laser interferometer. Also, for measuring the slant element of refractive index, a prism-shaped test piece was taken from an outside part of the above-mentioned disk, and the absolute value of refractive index was measured, with a highly precise spectrometer, with a precision of $10^{-7}$ order by the minimum deviation angle method. Also, the upper part of the cut-out sample was cut into a block of a dimension of H30×L150×t10 mm (including the geometrical center of the ingot), which was then polished on four lateral faces as a specimen for measuring the hydrogen molecule concentration. The remainder was also cut into a block of a dimension of φ60×t12 mm (with an orientation flat of 5 mm), which was polished on three faces as a specimen for measurements of hydrogen molecule concentration and transmittance and for excimer laser irradiation (cf. FIG. 8).

The hydrogen molecule concentration was measured with a laser Raman spectrophotometer. The quantitative measurement was conducted by setting the sample on a sample table, then measuring the intensities at 800 and 4135 cm$^{-1}$ in the Raman scattered light generated from the sample in the perpendicular direction when it is irradiated with the light of an Ar$^+$ laser (800 mW), and calculating the ratio of said intensities (V. S. Khotimchenko et al., J. Appl. Spectrosc., 46, 632–635 (1987)).

The transmittance was determined by the internal transmittance at a thickness of 10 mm in the sample. The measurement was conducted with a near infrared-visible-ultraviolet double-beam spectrophotometer, by setting samples of thicknesses of 2 mm and 12 mm (both being taken from a same lot) respectively at the reference side and the measuring side, and this method allowed determination of the internal transmittance at a thickness of 10 mm, without the mutliple reflection component and the surface reflection component within the sample. In the measurement, following operations were conducted in order to improve the precision of the spectrophotometer:

1) At least three samples of different thicknesses, within a range of 1–30 mm, easily settable in the sample chamber of the spectrophotometer, were subjected to the measurement of spectral transmittance including the reflection loss, and the internal transmittance was determined by calculation; and 2) The spectral transmittance including reflection loss was measured, assuming that the internal transmittance of silica glass synthesized by the direct method was 100.00% at 365 nm, and the optical axis of the spectrophotometer was so adjusted that the difference between the thus measured transmittance and the theoretical transmittance 92.92% is maintained within ±0.01% within a sample thickness range of 1–30 mm. This operation calibrates the aberration, from the theoretical transmittance, of the spectral transmittance including reflection loss. The above-mentioned aberration occurs when the thickness of the sample increases, due to a variation in the optical path, caused by the sample insertion or by the fluctuation in sensitivity of the photoelectric converting face of the photomultiplier.

These operations allowed, in the measurement of spectral transmittance of silica glass synthesized by the direct method, in a wavelength region below 300 nm, maintenance the aberration within ±0.01% between the theoretical transmittance and the spectral transmittance including the reflection loss resulting from the increase in sample thickness, thereby improving the precision of measurement of the internal transmittance.

Also, the irradiation with the light of excimer laser was conducted with a KrF excimer laser (248 nm) and an ArF excimer laser (193 nm), up to $1 \times 10^6$ pulses with respective energy densities of 400 and 100 mJ/cm$^2$·pulse.

Samples prepared for the measurement of physical properties were those of numbers 1 and 2 shown in Table 1.

Figure 3:
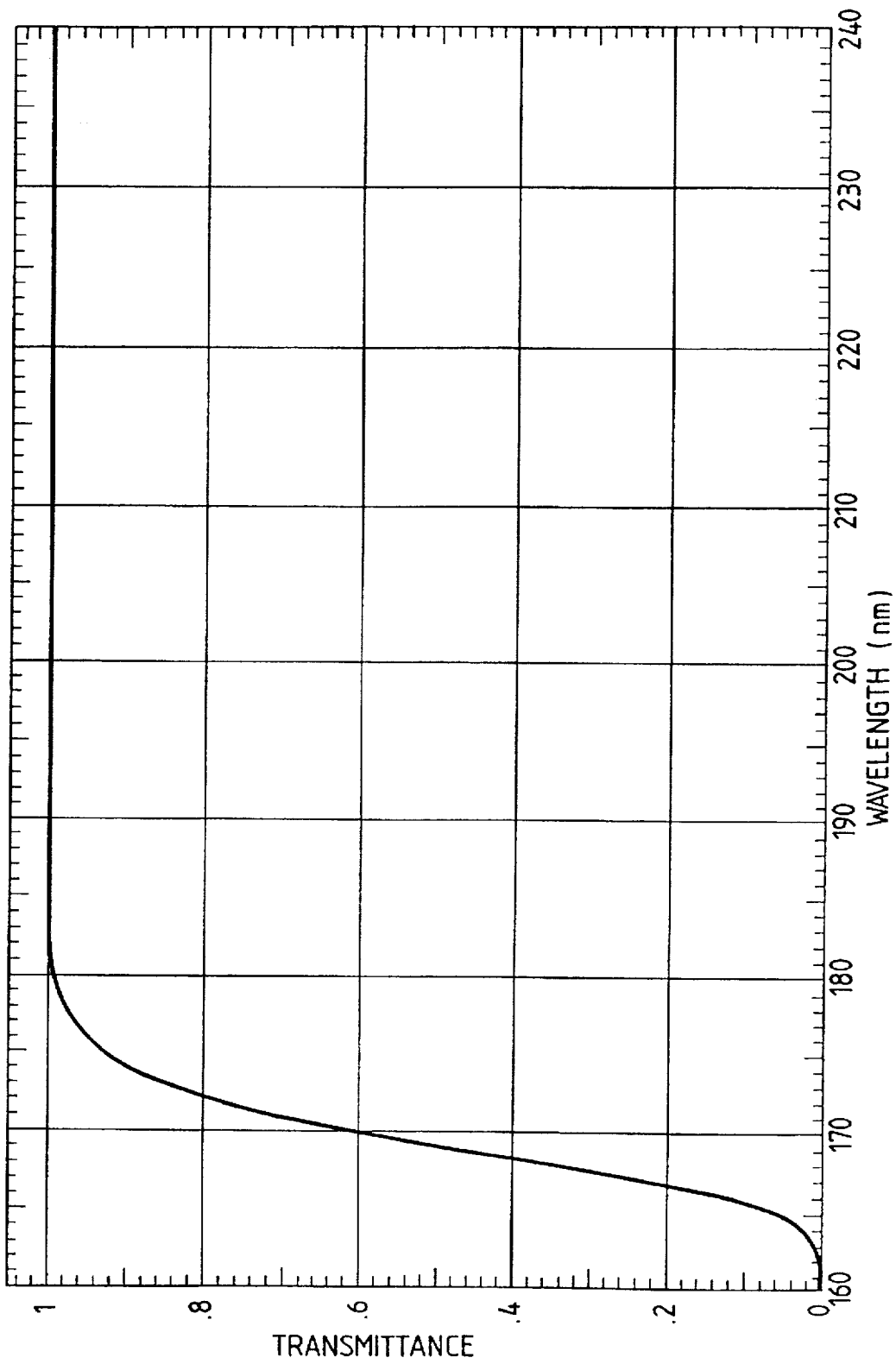
FIG. 3 is a chart showing an example of the result of transmittance measurement of the embodiment.

The sample 1 contained a very large amount of dissolved hydrogen molecules, as much as $4.1 \times 10^{18}$ molecules/cm$^3$. Also, when the raw material was changed from silicon tetrachloride to trichlorosilane (sample 2), there were found hydrogen molecules at a level of $3.1 \times 10^{18}$ molecules/cm$^3$. In either case, the difference in the hydrogen molecule concentration between the central and peripheral areas was within $2 \times 10^{17}$ molecules/cm$^3$. Also, in either of these samples, the refractive index distribution in the cross section including the incident optical axis was rotationally symmetrical, with only one maximum or minimum value. Furthermore, the refractive index distribution was satisfactory in the axial direction and in a direction perpendicular thereto. As shown in FIG. 3, the transmittances at 248 nm and 193 nm were higher than 99.9%, and the transmittance after excimer laser irradiation was higher than 99.0% in both samples. The transmittance in a range of 185–400 nm did not change before and after the irradiation.

[Reference example 1-1]

Samples prepared are those of numbers 3 to 6 in Table 1. The synthesis was conducted in basically same manner as in the example 1-1. The sample 3 was obtained by employing hydrogen carrier and maintaining a higher excess in hydrogen in the oxygen/hydrogen ratio of the combustion gas in the outermost area than in that of the concentric multiple tubes. On the other hand, the samples 4, 5 and 6 were obtained by respectively employing oxygen carrier, helium carrier and argon carrier, and maintaining an oxygen/hydrogen ratio of 0.44 in the gas emitted from the concentric gas emission tubes. These samples were subjected to the measurements of physical properties under the same conditions as in the example 1-1. The sample 3 contained an even larger amount of hydrogen molecules, at a level of 1.7 times of that in the example 1-1, and the hydrogen molecule concentration was higher at the central area, but the difference in concentration between the central and peripheral areas was larger, in excess of $5 \times 10^{17}$ molecules/cm$^3$. Also, even before the irradiation, it had an absorption band in the vacuum ultraviolet region, showing an inferior transmittance at 193 nm. In the excimer laser irradiation tests, a loss in transmittance occurred in the initial period of irradiation, thus deteriorating the transmittance after the irradiation, particularly at the wavelength of ArF excimer laser. The $\Delta n$ and RMS values in the axial direction were rotationally symmetrical, showing only one maximum value in the refractive index in the cross section including the incident optical axis, but deterioration in $\Delta n$ was observed. The sample 4 did not show the absorption band initially and showed satisfactory transmittance, but the hydrogen molecule concentration was as low as $3.5 \times 10^{17}$ molecules/cm$^3$. The hydrogen molecule concentration was lower in the peripheral area than in the central area, with a difference less than $2 \times 10^{17}$ molecules/cm$^3$. Both $\Delta n$ and values were rotationally symmetrical, with only one extreme value in the refractive index in the cross section including the incident optical axis. These values were at relatively good levels, though there were observed certain numerical deteriorations. In the excimer laser irradiation tests, the transmittance was slightly lowered after the irradiation, both at the KrF wavelength and at the ArF wavelength. Samples 5 and 6 were free from absorption band initially and showed satisfactory transmittance, but the hydrogen molecule concentration was very low, lower than $1 \times 10^{17}$ molecules/cm$^3$, so that, in the excimer laser irradiation tests, both samples showed significant deterioration in the transmittance after the irradiation, both in the KrF and ArF wavelengths. The distribution thereof was M-shaped, because of the exclusion effect of inert gas. The $\Delta n$ and RMS values were rotationally symmetrical, but the refractive index in the cross section including the incident optical axis shows plural extreme values. Numerically, these values were at relatively good levels, though there were observed certain deteriorations.

[EXAMPLE 1-2]

Figure 6:
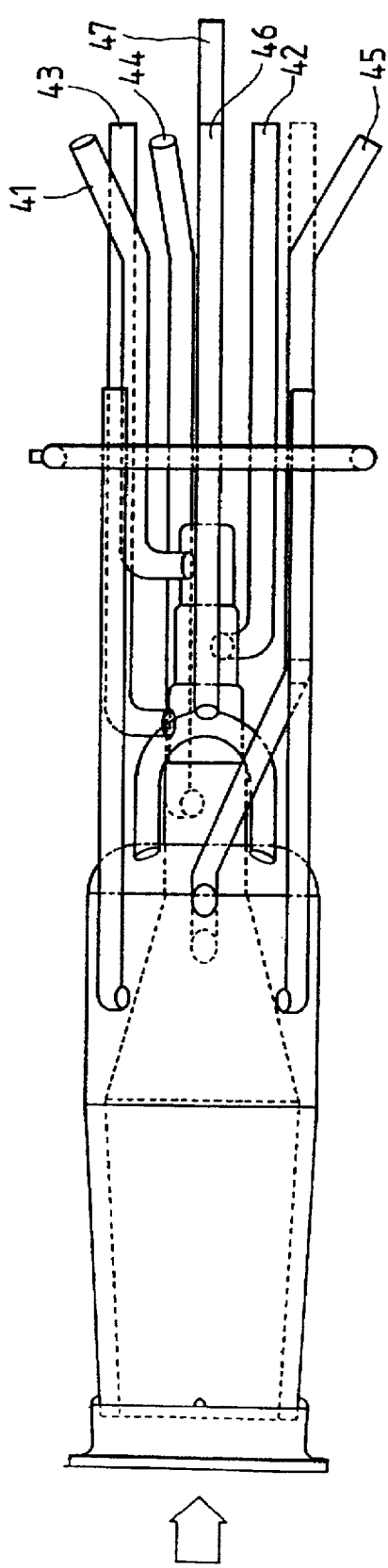
FIG. 6 is an external view of a burner employed in the synthesis of silica glass.
Figure 7:
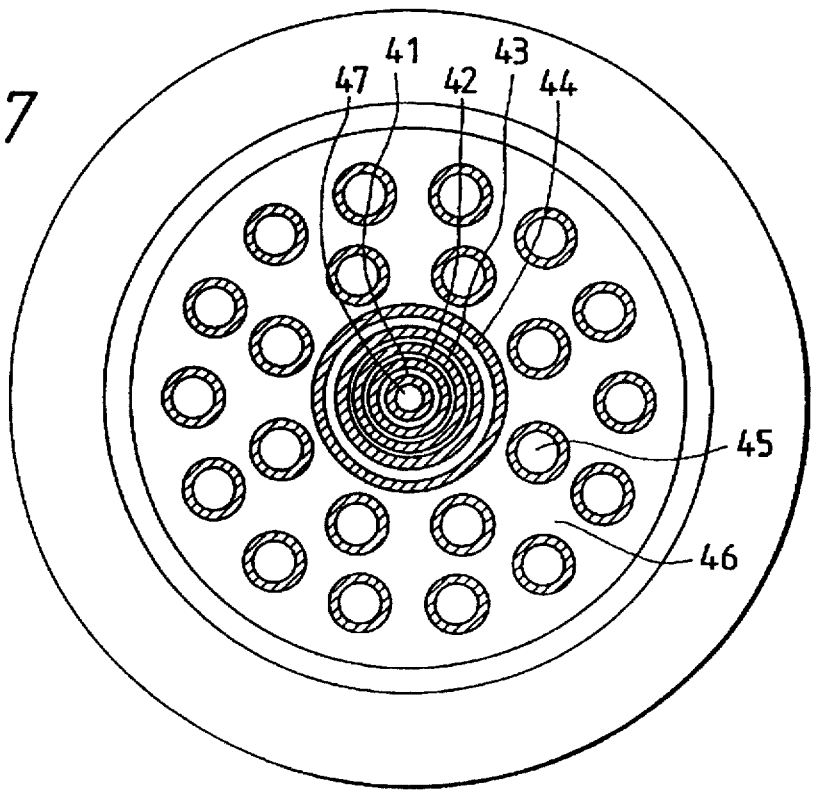
FIG. 7 is a view of the burner shown in FIG. 6, seen from a direction indicated by an arrow therein (wherein numbers correspond to those in Table 2 indicating the gas species and flow rates thereof.

Samples 7 and 8 were synthesized with a burner shown in FIGS. 6 and 7. The method of synthesis was same as in the example 1-1, and the raw material, diluted with carrier gas was emitted from 47 shown in FIGS. 6 and 7. The conditions of synthesis are shown in Table 2. The samples 7 and 8 were respectively obtained by the oxygen/hydrogen ratio of 0.293 in the gas from the 2nd and 3rd tubes, and by the oxygen/hydrogen ratio of 0.293 in the gas from the 4th and 5th tubes. These samples were subjected to measurements of physical properties under the same conditions as in the example 1-1. Both samples showed hydrogen molecule concentrations in excess of $10^{18}$ molecules/cm$^3$, though they were somewhat lower than that in the example 1, and the difference in concentration between the central and peripheral areas was less than $2 \times 10^{17}$ molecules/cm$^3$. In both samples 7 and 8, the refractive index distribution was rotationally symmetrical, with only one extreme value in the refractive index in the cross section including the incident optical axis. Also, in both samples, the $\Delta n$ and RMS values were satisfactory, and the initial transmittance and the transmittance after excimer laser irradiation were in excess of 99.9% both in the KrF and ArF wavelengths. Furthermore, the transmittance in the range of 185–400 nm did not show variation between before and after the irradiation. The obtained samples were larger in diameter than the samples 1, 2 in the example 1-1, but they were comparable in performance to said samples 1, 2.

[Reference example 1-2]

Samples 9 and 10 were synthesized with the burner shown in FIGS. 6 and 7, employing oxygen carrier. The method of synthesis was same as in the example 1-1. These samples showed the following physical properties. The refractive index distribution was symmetrical with respect to the center, with one extreme value in the distribution in the cross section including the incident optical axis, but the Δn and RMS values were slightly worse than those in the samples 7 and 8. The hydrogen molecule concentration was $4.3 \times 10^{17}$ molecules/cm$^3$ in the sample 9 and below the detection limit ($<10^{16}$ molecules/cm$^3$) in the sample 10, thus being significantly lower than in the samples 7 and 8. The difference in concentration between the central and peripheral areas was less than $2 \times 10^{17}$ molecules/cm$^3$. The initial transmittance was higher than 99.9% in all the cases, but was lowered both in the KrF and ArF wavelengths after the excimer laser irradiation. Measurements were also carried out on a sample 11, synthesized with hydrogen carrier and with a higher hydrogen excess state in the oxygen/hydrogen ratio in the outermost combustion gas than in that in the concentric multiple tubes. This sample contained hydrogen molecules larger by about 1.6 times than those in the sample 7 of the example 1-2, but showed an absorption band in the vacuum ultraviolet region and was inferior in the initial transmittance at 193 nm. In the excimer laser irradiation tests, there was observed a loss in the transmittance in the inital stage, thus deteriorating the transmittance after the irradiation, particularly at the ArF wavelength. The Δn and RMS values were symmetrical with one extreme value, but they were numerically somewhat worse.

[EXAMPLE 1-3]

A projection lens as described in connection with FIG. 2, and designed for ArF excimer laser light source, was constructed with silica glass optical elements, prepared from the silica glass of the sample 1 in the example 1-1, by maintaining the geometrical center of the ingot as shown in FIG. 1, and it was confirmed that the desired design performance was satisfied. Thus there was obtained a resolution of less than 0.3 μm, and there could be obtained an integrated circuit pattern with practically satisfactory flatness. The optical performance was maintained for a prolonged period without deterioration.

[EXAMPLE 2]

Three ingots of ɸ200, 320, 450 mm×L800 mm free from striae in three directions were prepared in a method similar to that of the example 1-2, under precise control of the conditions of synthesis (burner structure, gas amounts, traverse pattern of target, etc.).

Each ingot was immersed in aqueous solution of hydrofluoric acid for removing surfacially deposited SiO$_2$ powder, then cut into a suitable length and subjected to the measurement of homogeneity in cylindrical form, by an interferometer. Within the range of measurement, the refractive index distribution was symmetrical, and the center of geometrical external form of the ingot coincided with that of the refractive index distribution. Also, the refractive index distribution showed only one extreme value.

Cylindrical silica glass members of ɸ140×t40, ɸ180×t60 and ɸ300×t70 mm were obtained from the center of the ingot, utilizing a core drill at the geometrical center determined from the external form of the ingot. For strain removal and adjustment of homogeneity, these members were subjected to annealing at the center of an annealing oven having symmetrical temperature distribution. The annealing was conducted by heating at 1000° C. for 24 hours, then cooling to 500° C. at a rate of 10° C./min., and spontaneous cooling thereafter.

The thus obtained silica glass members showed homogeneity in respective RMS values of 0.005λ, 0.006λ and 0.006λ.

As the slant element of refractive index was very difficult to determine directly with the interferometer two prism-shaped test pieces were taken from radial ends of each member and subjected to the measurement of refractive index of a precision of $10^{-7}$ order, employing the minimum deviation angle method with a highly precise spectrophotometer. The difference in refractive index between two test pieces was below the limit of measurement, so that the slant element was less than $10^{-7}$.

In these samples, the hydrogen molecule concentration was respectively $2.5 \times 10^{18}$, $2.0 \times 10^{18}$ and $3.3 \times 10^{18}$ molecules/cm$^3$, and was higher in the central part than in the peripheral part, with a difference less than $2 \times 10^{17}$ molecules/cm$^3$.

These samples showed internal transmittance higher than 99.9% before and after the irradiation with KrF or ArF excimer laser. Also, they showed no variation in the transmittance in a range from 185–400 nm, between before and after the irradiation.

A projection lens as described in connection with FIG. 2, and constructed by working these silica glass members as shown in FIG. 1, satisfied the desired design performance. Thus there could be obtained an integrated circuit pattern of a geometry of about 0.3 μm, having practically sufficient flatness.

[EXAMPLE 3]

An ingot of ɸ300×t750 mm free from striae in three directions was prepared in a method similar to that of the example 1-2, under precise control of the conditions of synthesis (burner structure, gas amounts, traverse pattern of target, etc.). This ingot was immersed in aqueous solution of hydrofluoric acid for removing surfacially deposited SiO$_2$ powder, then cut into suitable lengths and subjected to the measurement of homogeneity in cylindrical form, by an interferometer. Within the range of measurement, the refractive index distribution was symmetrical, and the center of geometrical external form of the ingot coincided with that of the refractive index distribution. However, though the refractive index distribution had only one extreme value, the homogeneity was of a level that was uncontrollable by the ordinary annealing process as shown in the exmaple 2 (RMS=0.025λ).

A cylindrical silica glass member of ɸ250×t120 mm was obtained from the center of the ingot, utilizing a core drill at the geometrical center determined from the external form of the ingot. For the adjustment of homogeneity, it was subjected to a secondary heat treatment, consisting of heating at 2000° C. for 12 hours in Ar atmosphere of 9 atm.

The heat treatment was conducted under rotation, by placing the cylindrical glass member on a turn-table in the furnace, with the geometrical center of said glass member positioned at the rotatory center of the turn-table, because the refractive index distribution may become unsymmetrical by the deviated heat flow at the cooling and by unsymmetrical plastic deformation when the glass member is fused.

Thereafter, annealing and working were conducted with the maintenance of rotary symmetry as in the example 1, thereby providing a silica glass member of substantially symmetrical rotational refractive index distribution, with RMS=0.006λ and a small slant element.

The hydrogen molecule concentration of this sample was $7.6 \times 10^{17}$ molecules/cm$^3$, and was higher in the central area than in the peripheral area, with a difference less than $2 \times 10^{17}$ molecules/cm$^3$.

This sample showed internal transmittance higher than 99.9% before and after irradiation with KrF or ArF excimer laser. Also, it showed no variation in the transmittance in a range of 185–400 nm, between before and after the irradiation.

A projection lens as described in connection with FIG. 2, and constructed by working this silica glass member as shown in FIG. 1, satisfied the desired design performance. By means of this projection lens, there could be obtained an integrated circuit pattern of a geometry of about 0.3 μm, having practically sufficient flatness.

What is claimed is:

1. An optical element for use in UV-lithography in a specified wavelength region of 400 nm or shorter, comprising a silica glass member having a hydrogen molecule concentration which is equal to or higher than $5 \times 10^{17}$ molecules/cm$^3$ and which is higher in a central area than in a peripheral area.

2. An optical element according to claim 1, wherein a diameter of said silica glass member is 150 mm or larger and a thickness thereof is 50 mm or larger.

3. An optical element according to claim 1, wherein a difference in hydrogen molecule concentration between the central and peripheral areas does not exceed $2 \times 10^{17}$ molecules/cm$^3$.

* * * * *